(12) United States Patent
Chainer

(10) Patent No.: US 9,818,726 B2
(45) Date of Patent: Nov. 14, 2017

(54) CHIP STACK COOLING STRUCTURE

(71) Applicant: International Business Machines Corporation, Armonk, NY (US)

(72) Inventor: Timothy J. Chainer, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/981,120

(22) Filed: Dec. 28, 2015

(65) Prior Publication Data
US 2017/0186728 A1   Jun. 29, 2017

(51) Int. Cl.
*H01L 21/768* (2006.01)
*H01L 23/00* (2006.01)
(Continued)

(52) U.S. Cl.
CPC .... *H01L 25/0657* (2013.01); *H01L 21/76898* (2013.01); *H01L 23/043* (2013.01); *H01L 23/053* (2013.01); *H01L 23/3738* (2013.01); *H01L 23/473* (2013.01); *H01L 23/481* (2013.01); *H01L 24/17* (2013.01); *H01L 24/32* (2013.01); *H01L 24/73* (2013.01); *H01L 25/073* (2013.01); *H01L 25/50* (2013.01); *H01L 2224/16245* (2013.01); *H01L 2224/2919* (2013.01); *H01L 2224/29147* (2013.01); *H01L 2224/29186* (2013.01);
(Continued)

(58) Field of Classification Search
CPC .............. H01L 23/473; H01L 23/3738; H01L 25/0657; H01L 2224/16245; H01L 2224/32245; H01L 2225/06517; H01L 2225/06541; H01L 2225/06589
See application file for complete search history.

(56) References Cited

U.S. PATENT DOCUMENTS 4,567,505 A * 1/1986 Pease .................... H01L 23/367
165/104.33
4,868,712 A   9/1989 Woodman
(Continued)

FOREIGN PATENT DOCUMENTS

WO   WO 7901012 A1 * 11/1979 ........... H01L 23/051

OTHER PUBLICATIONS

X. Wei et al., "Experimental and Numerical Study of a Stacked Microchannel Heat Sink for Liquid Cooling of Microelectronic Devices," Journal of Heat Transfer, Oct. 2007, pp. 1432-1444, vol. 129, No. 10.
(Continued)

*Primary Examiner* — Kevin Parendo
(74) *Attorney, Agent, or Firm* — Daniel P. Morris; Ryan, Mason & Lewis, LLP

(57) ABSTRACT

An apparatus comprises a first die, a thermal cooler formed over at least a portion of the first die, a second die formed over at least a portion of the thermal cooler, and a plurality of through-silicon vias providing electrical connections between the first die and the second die. The thermal cooler comprises a plurality of fluid channels for fluid cooling of the first die and the second die, the plurality of fluid channels being formed horizontally through the thermal cooler. The plurality of through-silicon vias are formed vertically through the first die, the thermal cooler and the second die.

20 Claims, 15 Drawing Sheets

(51) Int. Cl.
*H01L 23/043* (2006.01)
*H01L 23/053* (2006.01)
*H01L 23/373* (2006.01)
*H01L 23/473* (2006.01)
*H01L 23/48* (2006.01)
*H01L 25/00* (2006.01)
*H01L 25/065* (2006.01)
*H01L 25/07* (2006.01)

(52) U.S. Cl.
CPC ............... *H01L 2224/29187* (2013.01); *H01L 2224/29188* (2013.01); *H01L 2224/29191* (2013.01); *H01L 2224/32245* (2013.01); *H01L 2224/73253* (2013.01); *H01L 2225/06517* (2013.01); *H01L 2225/06541* (2013.01); *H01L 2225/06568* (2013.01); *H01L 2225/06589* (2013.01); *H01L 2924/01029* (2013.01)

(56) References Cited

U.S. PATENT DOCUMENTS

| | | | |
|---|---|---|---|
| 5,241,450 A | 8/1993 | Bernhardt et al. | |
| 7,091,604 B2 | 8/2006 | Wylie et al. | |
| 7,432,592 B2 | 10/2008 | Shi et al. | |
| 9,220,183 B1* | 12/2015 | Buvid | H05K 7/20236 |
| 9,524,917 B2* | 12/2016 | Oganesian | H01L 23/3675 |
| 2007/0177351 A1* | 8/2007 | Monfarad | H01L 23/473 |
| | | | 361/699 |
| 2008/0036064 A1* | 2/2008 | Han | H01L 23/427 |
| | | | 257/686 |
| 2008/0079144 A1* | 4/2008 | Tang | H01L 23/473 |
| | | | 257/706 |
| 2009/0108435 A1* | 4/2009 | Bernstein | H01L 23/473 |
| | | | 257/691 |
| 2009/0251862 A1 | 10/2009 | Knickerbocker et al. | |
| 2009/0283898 A1* | 11/2009 | Janzen | H01L 21/76898 |
| | | | 257/698 |
| 2010/0187683 A1* | 7/2010 | Bakir | H01L 23/3677 |
| | | | 257/713 |
| 2012/0001341 A1* | 1/2012 | Ide | H01L 23/473 |
| | | | 257/773 |
| 2012/0054422 A1* | 3/2012 | Gu | G11C 11/4076 |
| | | | 711/105 |
| 2012/0063090 A1* | 3/2012 | Hsiao | H01L 23/44 |
| | | | 361/699 |
| 2014/0015119 A1* | 1/2014 | Bonkohara | H01L 23/473 |
| | | | 257/713 |
| 2015/0255434 A1* | 9/2015 | Yazdani | H01L 21/486 |
| | | | 257/737 |
| 2016/0056089 A1* | 2/2016 | Taniguchi | H01L 25/0657 |
| | | | 257/714 |

OTHER PUBLICATIONS

A.M. Palagonia, "Method for Cooling a Stack of Laminated Chips," IP.com No. IPCOM000118250D, Nov. 1, 1996, pp. 151-152, vol. 39, No. 11.

T. Brunschwiler et al., "Forced Convective Interlayer Cooling in Vertically Integrated Packages," 11th Intersociety Conference on Thermal and Thermomechanical Phenomena in Electronic Systems (ITHERM), May 2008, pp. 1114-1125.

H. Lee et al., "Package Embedded Heat Exchanger for Stacked Multi-Chip Module," Sensors and Actuators A: Physical, Sep. 2004, pp. 204-211, vol. 114, Nos. 2-3.

M.K. Kang et al., "Analysis of Laminar Convective Heat Transfer in Micro Heat Exchanger for Stacked Multi-Chip Module," Microsystem Technologies, Oct. 2005, pp. 1176-1186, vol. 11, No. 11.

S.P. Tan et al., "Thermal Characterisation and Liquid Cooling System Integration for Stacked Modules," 9th Electronics Packaging Technology Conference (EPTC), Dec. 2007, pp. 179-183, Singapore.

* cited by examiner

100

106

400

1000

1200

1400

1500

1600

CHIP STACK COOLING STRUCTURE

BACKGROUND

The present invention relates to semiconductors, and more specifically, to cooling semiconductors. A three-dimensional integrated circuit (3D IC) may be formed by stacking multiple dies, where the stacked dies are interconnected vertically using through-silicon vias (TSVs). The heat generated by a high power die is removed by attaching a heatsink or coldplate on the top of the die. To meet the thermal requirements of stacking multiple dies in a 3D IC, the stack is limited to low power chips or the die of the stack which utilizes the most power or otherwise generates the most heat is typically placed at the top of the stack closest to the heatsink with lower power dies placed below.

SUMMARY

Embodiments of the invention provide for cooling within a 3D IC or other chip stack allowing for optimizing of electrical performance.

For example, in one embodiment, an apparatus comprises a first die, a thermal cooler formed over at least a portion of the first die, a second die formed over at least a portion of the thermal cooler, and a plurality of through-silicon vias providing electrical connections between the first die and the second die. The thermal cooler comprises a plurality of fluid channels for fluid cooling of the first die and the second die, the plurality of fluid channels being formed horizontally through the thermal cooler. The plurality of through-silicon vias are formed vertically through the first die, the thermal cooler and the second die.

DETAILED DESCRIPTION

Illustrative embodiments of the invention may be described herein in the context of illustrative methods, systems, apparatus and devices for cooling a 3D IC structure. However, it is to be understood that embodiments of the invention are not limited to the illustrative methods, systems and devices but instead are more broadly applicable to other suitable methods, systems, apparatus and devices.

As discussed above, 3D ICs are typically formed by stacking multiple die, also referred to as chips, where the stacked dies or chips are interconnected vertically using TSVs. A challenge in 3D IC integration, however, is to provide cooling of the 3D IC structure while also optimizing electrical performance. To meet thermal requirements for a 3D IC, also referred to herein as a chip stack, the chip that utilizes the most power is typically paced at the top of the chip stack closest to a heatsink. The chips that utilize lower power are placed below. While in some cases such an arrangement optimizes the thermal performance of the chip stack, such arrangements do not necessarily provide optimal electrical performance due to interconnects through the chip stack for both power and signal leads.

Embodiments of the invention provide 3D IC structures having a thermal cooling solution that allows designers to optimize electrical and thermal performance, thereby improving overall system performance. In some embodiments, a thermal cooler unit is incorporated into the 3D IC structure. The thermal cooler unit provides cooling capability while simultaneously allowing signal and power leads or other electrical connections to be routed through the thermal cooler using TSVs.

Figure 1:
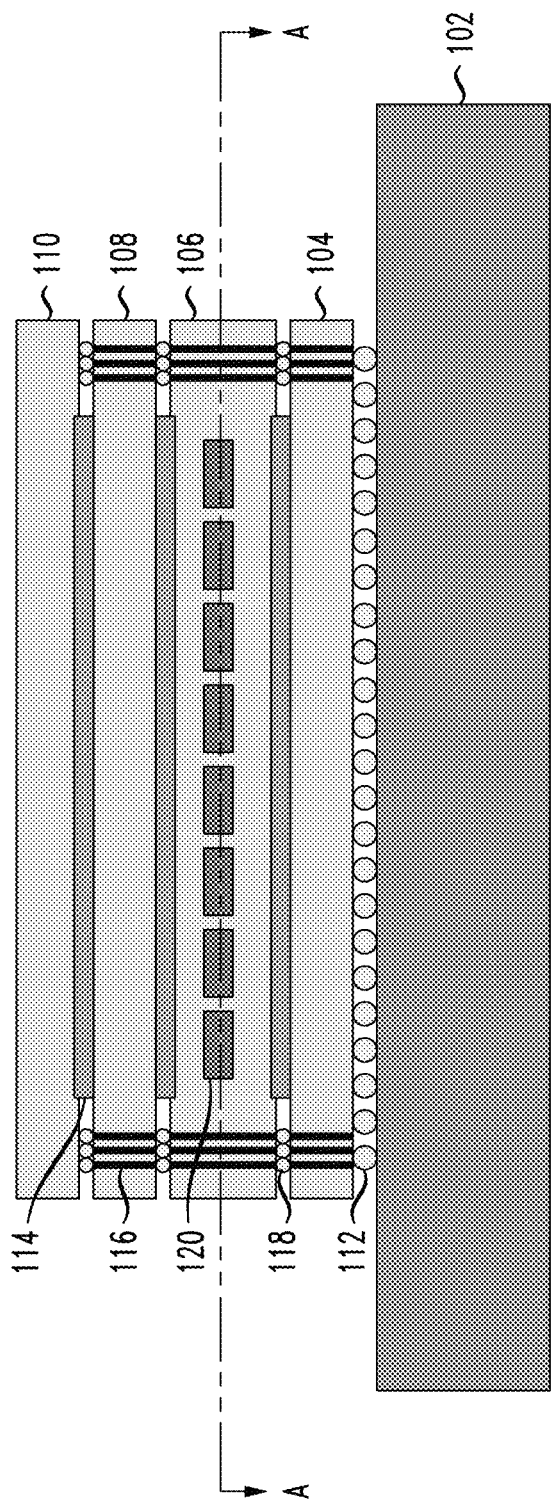
FIG. 1 depicts a side cross-sectional view of a chip stack including a thermal cooling unit, according to an embodiment of the present invention.

FIG. 1 depicts a side cross-sectional view of a chip stack 100. The chip stack 100 includes a substrate 102, a first die 104, a thermal cooling unit 106, a second die 108 and a third die 110. The various dies in the stack may be, by way of example, microprocessors (CPUs), graphics accelerators (GPUs), field programmable logic arrays (FPGAs), memory such as dynamic random access memory (DRAM) or magnetoresistive random access memory (MRAM), application specific integrated circuits (ASICs), etc. Depending on the cooling requirements for a particular implementation, the die 110 may be a functional die or may be another cooling unit so as to provide additional cooling for other dies in the stack.

Although FIG. 1 shows a chip stack 100 wherein only a single die 104 is below the thermal cooling unit 106 while two dies 108 and 110 are above the thermal cooling unit 106, embodiments are not limited to this arrangement. In other embodiments, a chip stack includes a thermal cooling unit interposed with one or more dies or chips below and one or more dies or chips above.

In the chip stack 100, substrate 102 may be made of, for example, a ceramic, glass, silicon or organic material to provide electrical and/or fluid connections to the chip stack 100, as will be described in further detail below with respect to FIG. 12. Various other materials for substrate 102 and other substrates described herein may be used in other embodiments.

The cooling unit 106 can be made from a wide range of materials. To reduce thermal induced stress in the chip stack 100, in some embodiments it is desirable to choose a material that has a coefficient of thermal expansion that is close to silicon (typically 2.6 ppm/° C.). To improve the thermal performance, it is desirable to choose a material with high thermal conductivity In some embodiments, the cooling unit 106 and other cooling units described herein may be made of silicon such that the coefficient of thermal expansion matches that of the die in the chip stack 100 and/or substrate 102 while also having a reasonable high thermal conductivity (typically 48 W/m-K).

Figure 16:
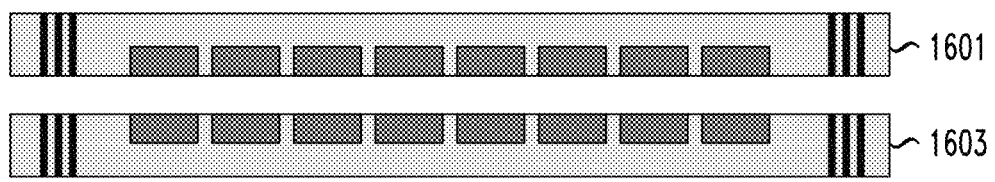
FIG. 16 depicts fabrication of a thermal cooling unit, according to an embodiment of the present invention.

In some embodiments, the cooling unit 106 is constructed from two silicon die halves bonded together as shown in FIG. 16, which will be described in further detail below. The thickness of each silicon die halve may be selected based on the maximum height of the TSVs. In some embodiments, the TSV manufacturing process may vary from 50 µm to 100 µm maximum height. The die halves may be bonded together using, by way of example, a copper bond that provides good thermal conductivity between the die haves for thermal transport between the die halves. In the case of 75 µm thick die halves, the cooling unit would have a total thickness of approximately 150 µm, and the fluid channels 120 formed therein may have a height of 100 µm providing a 25 µm wall at the top and bottom of each fluid channel 120. It is to be appreciated, however, that the above dimensions are provided by way of example only and that in other embodiments different dimensions may be used. In addition, the size of the different fluid channels 120 need not be uniform.

As shown in FIG. 1, the substrate 102 is bonded to the die 104 via one or more solder bumps 112 via flip chip bonding. In other embodiments, however, the substrate 102 may be bonded to die 104 via wire bonding. Wire bonding, however, requires the edge of the die 104 to protrude beyond the die placed on top of it, e.g., in the FIG. 1 example die 104 would have to protrude beyond die 108.

Thermal interface material 114 is formed between the die 104, microchannel cooler 106, die 108 and die 110 so as to improve thermal cooling of the 3D IC structure 100. By way of example, high performance interfill materials may be used, such as materials based on an epoxy resin used to connect different chip sector macros that make up the different dies in chip stack 100. The interfill material remains thermally stable throughout processing temperature hierarchies during interchip interconnection fabrication. Spherical $SiO_2$ powders may be incorporated into an epoxy resin to improve the mechanical properties, reduce the coefficient of thermal expansion and increase thermal conductivity of the interfill material.

Electrical connections, such as signal and power leads, are routed through TSVs 116, shown in FIG. 1 as being formed vertically on outer edges of the thermal cooling unit 106 and through the dies 104 and 108. In some embodiments, TSVs 116 connect the active circuitry, such as transistors, on the die in the chip stack 100 included in a front end of line (FEOL) layer. The side of the die in chip stack 100 with active transistors is called the frontside, which includes solder bumps, back end of line (BEOL) and FEOL transistors. The backside of the die in chip stack 100 would have the TSVs 116 and pads for bonding to the other dies in the chip stack 100. Although thinned die may be approximately 50-100 µm thick, the active circuits are on a thin layer on the same side as the bumps. TSVs 116 go from frontside transistors to the bonding pads on the backside. The backside of the die may be passivated to isolate the bonding pads from the silicon.

In FIG. 1, the dies 104, 108 and 110 are interconnected via the TSVs 116 and micro controlled-collapse chip-connection (µC4) interconnects 118. In some embodiments, TSVs 116 may provide connection between die in the chip stack without a cooling unit. As an example, in the chip stack 100, TSVs that interconnect die 108 and die 110 are not formed through the thermal cooling unit 106 and die 104.

As mentioned above, the thermal cooling unit 106 includes a number of fluid channels 120 formed horizontally therethrough. The fluid channels 120, and other fluid channels described herein, may also be referred to as microchannel coolers. Fabrication of a microchannel cooler will be described in further detail below with respect to FIG. 16.

Figure 2:
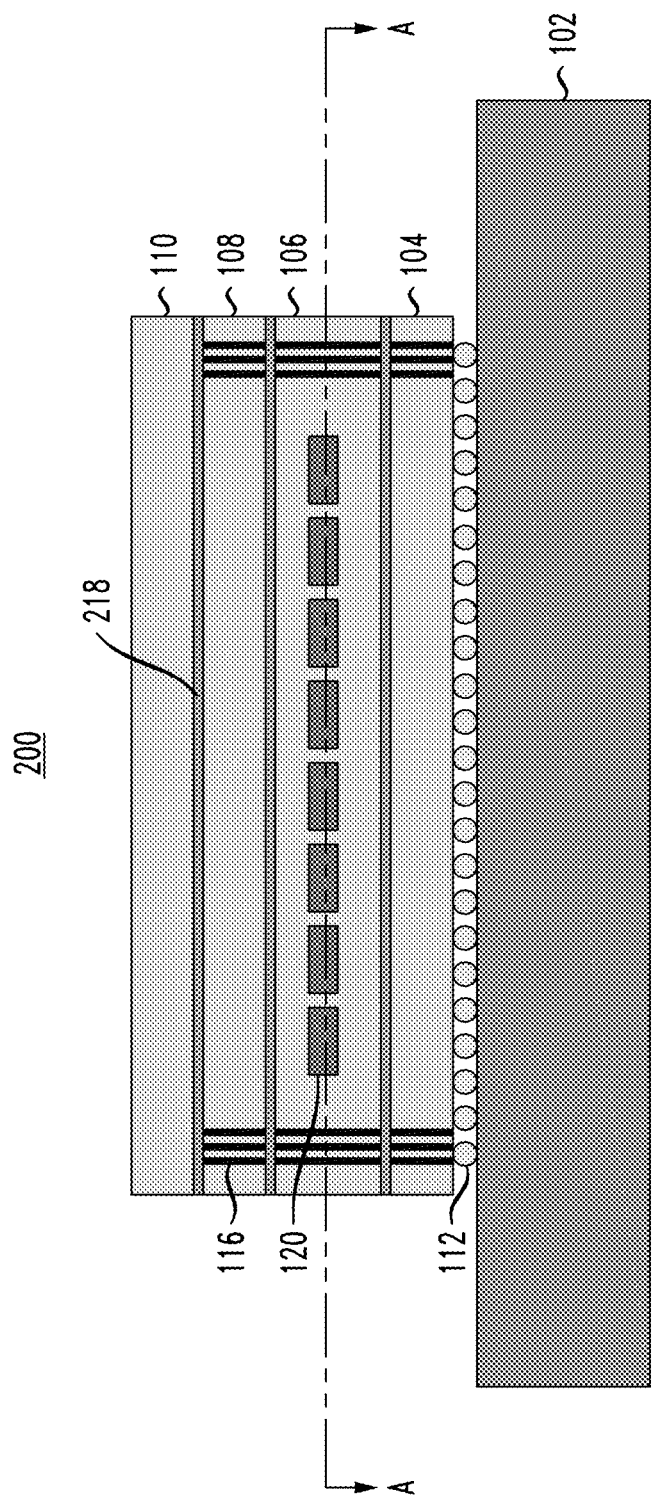
FIG. 2 depicts a side cross-sectional view of another chip stack including a thermal cooling unit, according to an embodiment of the present invention.

FIG. 2 depicts a side cross-sectional view of a chip stack 200, also including substrate 102, die 104, thermal cooling unit 106, die 108 and die 110. While the chip stack 100 in FIG. 1 bonds the die 104, thermal cooling unit 106, die 108 and die 110 via a thermal interface material 114 and connects the TSVs 116 using µC4 interconnects 118, the chip stack 200 bonds the die 104, thermal cooling unit 106, die 108 and die 110 via a thin adhesive or metal layer, 218, where the electrical connections between the TSVs 116 and dies 104, 108 and 110 are made with copper to copper pad (Cu—Cu) bonding. The thin adhesive or metal layer 218 may be, by way of example, copper.

The chip stack 200 shows an example of processing the various die at the wafer level, followed by dicing the wafer to form the completed die stack. In comparison, chip stack 100 shows an arrangement that may be used to stack individual die that have been diced from a wafer and then assembled into the completed die stack.

A brief explanation of wafer bonding using Cu—Cu bonding is provided below, but it is to be appreciated that embodiments are not limited solely to Cu—Cu bonding. Various other types of bonding may be used, including by way of example surface to surface bonding, other types of metallic interlayer bonding, insulator interlayer bonding, thin adhesives, etc.

Wafer bonding may use metallic copper as a bonding medium, also referred to as thermo-compression bonding. Copper provides several advantages as a bonding medium for 3D IC structures, as copper acts as an electrical bond for establishing conductive paths between active layers in the 3D IC structure as well as acting as a mechanical bond for holding the active layers together reliably. Metallic bonding also allows a via-first approach for vertical integration, relaxing aspect ratio requirements on interlayer vias. At the same time, the metal interface allows for additional wiring and routing and acts as a good heat conductor to circumvent heat dissipation problems in 3D ICs.

Wafer bonding with intermediate polymer adhesives is also an option. In adhesive wafer bonding, for example, polymer adhesives bear the forces involved to hold surfaces together. Polymer adhesives provide a number of advantages, including its insensitivity to surface topography, low bonding temperatures, compatibility with standard integrated circuit wafer processing, the ability to join different types of wafers, etc. Polymer adhesives are also simple, robust and low cost.

It is important to note that while various other chip stacks described below in conjunction with FIGS. 4-10 utilize a surface to surface, metal, thin adhesive or insulating layer 218 and Cu—Cu for bonding the dies and thermal cooling units, embodiments are not so limited. For example, the chip stacks described below in conjunction with FIGS. 4-10 may utilize a thermal interface material and μC4 interconnects rather than a surface to surface, copper, thin adhesive, or insulating layer 218 bonding. Further, in some embodiments not all the different dies and thermal cooling units need to be bonded via the same technique. As an example, a thermal cooling unit may be bonded to one die with a thin adhesive or oxide layer and Cu—Cu bonding while also being bonded to a second die with a thermal interface material and μC4 interconnects. For ease of fabrication, however, it may be preferred to utilize a single bonding technique. μC4 interconnects, for example, have solder bumps with a larger gap between die relative to copper pads. The larger gap in μC4 interconnects may be filled with a thermal conductive interfill, which may also provide mechanical support such that the μC4 interconnects are not the sole mechanical support. In some cases, it is not ideal to use electrical interconnects to provide mechanical support as the electrical interconnects take mechanical stress and break thus opening up the electrical interconnects such as μC4 interconnects. Where copper pads are used, the gaps between die are very small, and the dies may be bonded with surface-to-surface, metal, thin adhesive or oxides, among other options.

In other embodiments, however, it may be advantageous to utilize different bonding techniques. Copper bonds, for example, provide a better thermal conduction path between die in the chip stack relative to an oxide bond. In some cases, heat flow may be preferred in a particular direction. As such, for a particular die one side may use copper bonding while the other uses oxide.

Figure 3:
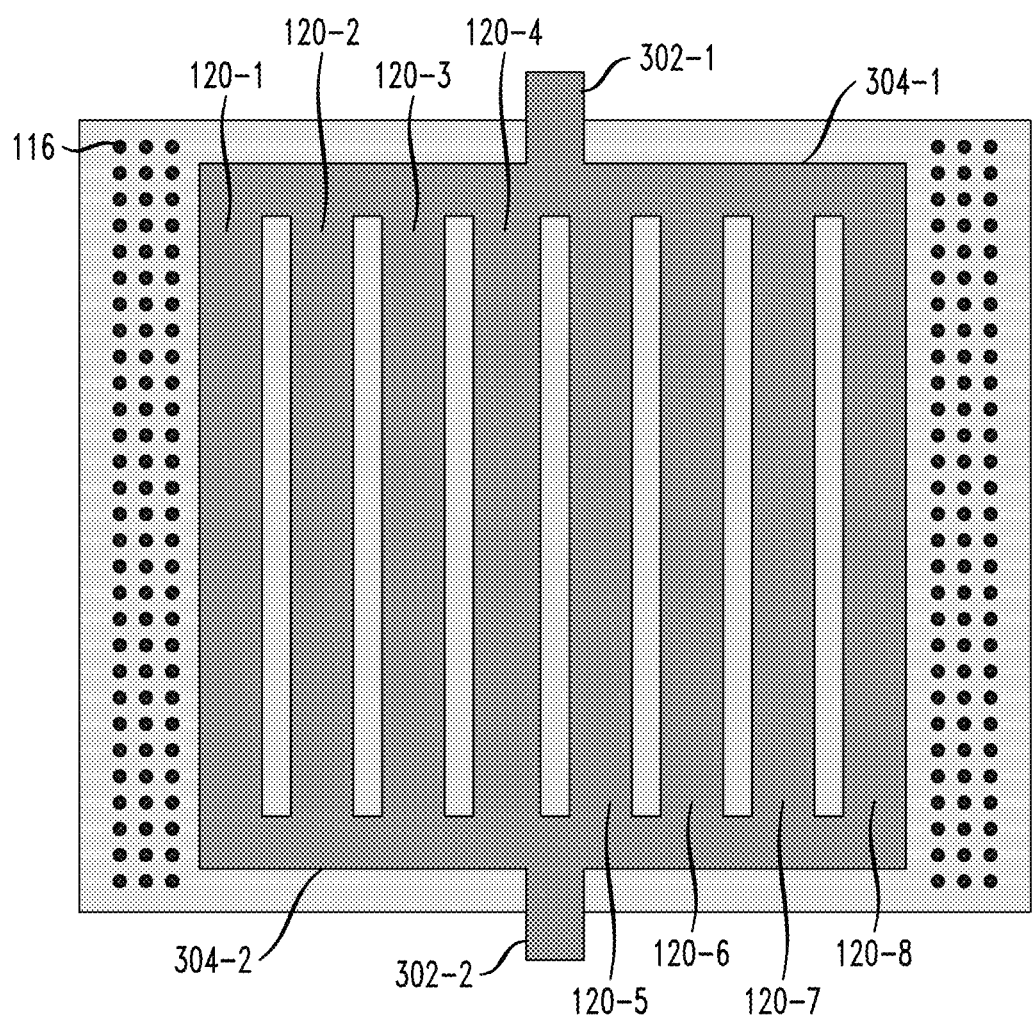
FIG. 3 depicts a top cross-sectional view of the thermal cooling unit of FIG. 1 or FIG. 2, according to an embodiment of the present invention.

FIG. 3 depicts a top cross-sectional view of the thermal cooling unit 106 of FIG. 1 and FIG. 2, taken along the line A-A shown in FIG. 1 and FIG. 2. As shown the TSVs 116 include three columns of TSVs on the left and right outer edges of the thermal cooling unit 106. It is to be appreciated, however, that the particular number of columns and rows of the TSVs 116 may be varied in other embodiments.

As shown, there are eight microchannel coolers denoted 120-1 through 120-8. Similar to the TSVs 116, however, the particular number of microchannel coolers 120 may vary in other embodiments. The respective ends of the microchannel coolers 120-1 through 120-8 are connected via common fluid channels 304-1 and 304-2. The thermal cooling unit 106 also includes fluid inlets/outlets 302-1 and 302-2. Although shown in FIG. 3 as including two fluid inlets/outlets, the thermal cooling unit 106 may in other embodiments have more than two fluid inlets/outlets. Further, while FIG. 3 depicts the fluid inlets/outlets 302 as being centered on the common fluid channels 304, this is not a requirement. One or both of the fluid inlets/outlets 302 may be positioned off-center in other embodiments. In still other embodiments, each of the microchannel coolers may extend from one edge of the thermal cooling unit 106 to another, and thus the respective ends of each microchannel cooler 120 may act as fluid inlets/outlets.

As shown in FIG. 3, the outer edge portion of the thermal cooling unit 106 containing the TSVs 116 does not overlap the inner portion of the thermal cooling unit 106 containing the microchannel coolers 120-1 through 120-8. In other embodiments described below, however, TSVs and microchannel coolers may be formed in a same portion or area of a thermal cooling unit. TSVs 116 may be placed in the microchannel coolers 120 if a dielectric or insulating fluid is used as will be described in further detail below in conjunction with FIGS. 8-9. If a conductive fluid such as water is used, then the TSVs 116 would require an insulating structure around each TSV.

Figure 4:
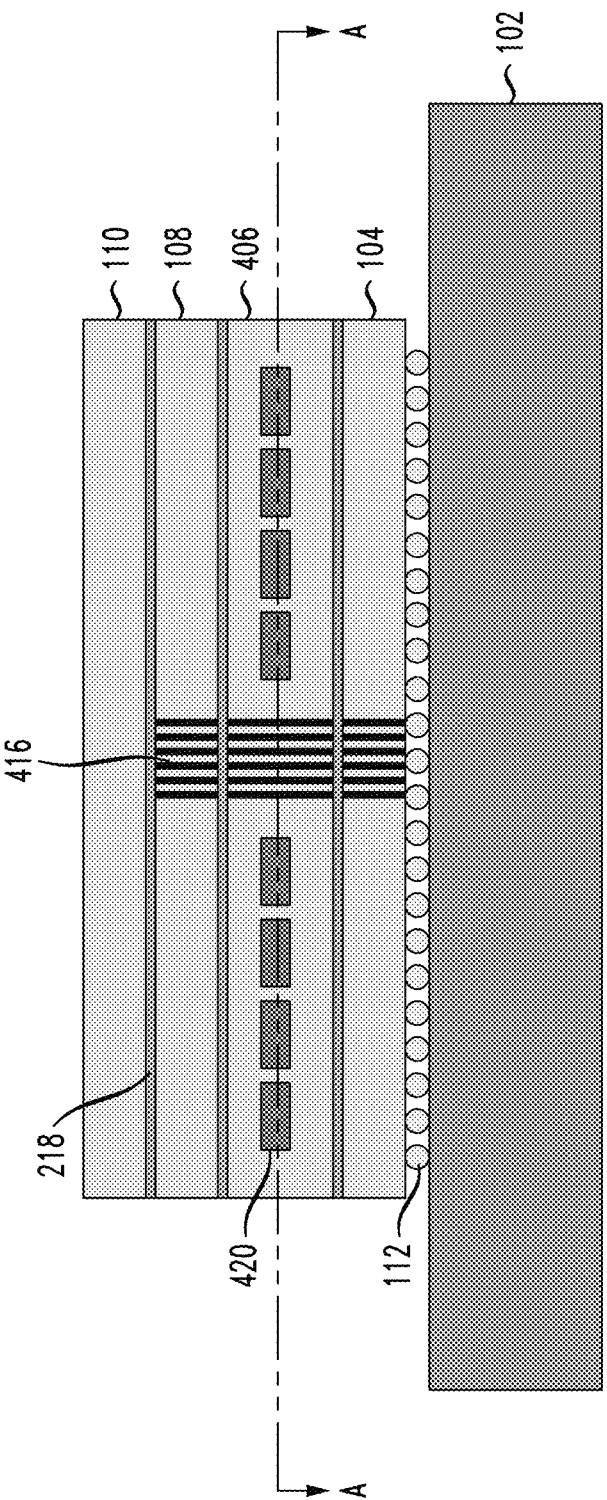
FIG. 4 depicts a side cross-sectional view of another chip stack including a thermal cooling unit, according to an embodiment of the present invention.

FIG. 4 depicts a side cross-sectional view of a chip stack 400. The elements 102, 104, 108, 110, 112 and 218 are similar to those described above with respect to FIGS. 1-3. The thermal cooling unit 406 of chip stack 400, however, differs from the thermal cooling unit 106 described above with respect to FIGS. 1-3. Whereas the thermal cooling unit 106 described above has TSVs 116 formed on the outer edges of the thermal cooling unit 106 with microchannel coolers 120 formed in an interior portion of the thermal cooling unit 106, the thermal cooling unit 406 includes TSVs 416 formed in a center or interior portion with microchannel coolers 420 formed in four quadrants proximate edges of the thermal cooling unit 406.

Figure 5:
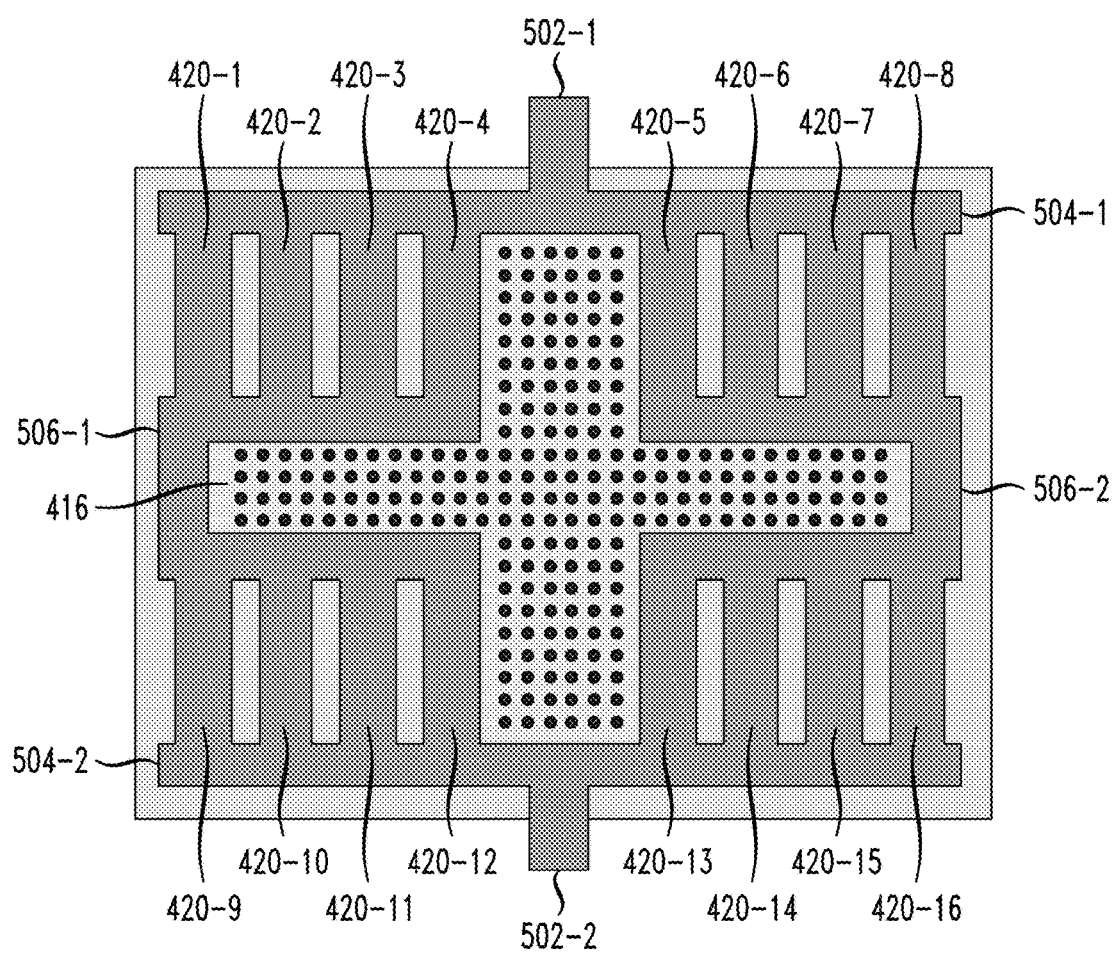
FIG. 5 depicts a top cross-sectional view of the thermal cooling unit of FIG. 4, according to an embodiment of the present invention.

FIG. 5 shows a top cross-sectional view of the chip stack 400 taken along the line A-A shown in FIG. 4. The FIG. 5 view highlights the cross-like pattern of TSVs 416 in an inner portion of thermal cooling unit 406, with microchannel coolers 420-1 through 420-16 formed in four quadrants near outer edge portions of the thermal cooling unit 406. As shown, the outer edge portions containing microchannel coolers 420-1 through 420-16 does not overlap with the inner portion containing the TSVs 416.

Whereas the microchannel coolers 120 extend continuously through the thermal cooling unit 106, the microchannel coolers 420 of thermal cooling unit 406 do not. A first set of the microchannel coolers 420, denoted 420-1 through 420-4 are in the upper left quadrant of the thermal cooling unit 406, a second set of the microchannel coolers denoted 420-5 through 420-8 are in the upper right quadrant of the thermal cooling unit 406, a third set of the microchannel coolers 420-9 through 420-12 are in the lower left quadrant of the thermal cooling unit 406, and a fourth set of the microchannel coolers 420-13 through 420-16 are in the lower right quadrant of the thermal cooling unit 406.

As shown in FIG. 5, first ends of the first set of microchannel coolers 420-1 through 420-4 as well as first ends of the second set of microchannel coolers 420-5 through 420-8 are connected to a common fluid channel 504-1. Similarly, first ends of the third set of microchannel coolers 420-9 through 420-12 and first ends of the fourth set of microchannel coolers 420-13 through 420-16 are connected to a common fluid channel 504-2. Second ends of the first and third sets of microchannel coolers 420-1 through 420-4 and 420-9 through 420-12 connect to a common fluid channel 506-1. Similarly, second ends of the second and fourth sets of microchannel coolers 420-5 through 420-8 and 420-13 through 420-16 connect to a common fluid channel 506-2. Similar to the thermal cooling unit 106, the thermal cooling unit 406 includes fluid inlets/outlets 502-1 and 502-2.

Although the thermal cooling unit 406 includes the same number of microchannel coolers in each quadrant, embodiments are not so limited. In other embodiments, some quadrants may contain more or fewer than four microchannel coolers including an arrangement in which at least one quadrant does not contain any microchannel coolers. In addition, in other embodiments there may be different numbers and positioning of the fluid inlets/outlets 502.

FIGS. 1-5 show two possible arrangements of TSVs and microchannel coolers in thermal cooling units. Embodiments, however, are not limited solely to the specific arrangements shown in FIGS. 1-5. In other embodiments, various other patterns of TSVs and microchannel coolers may be used, including by way of example alternating rows and/or columns of TSVs and microchannel coolers.

Figure 6:
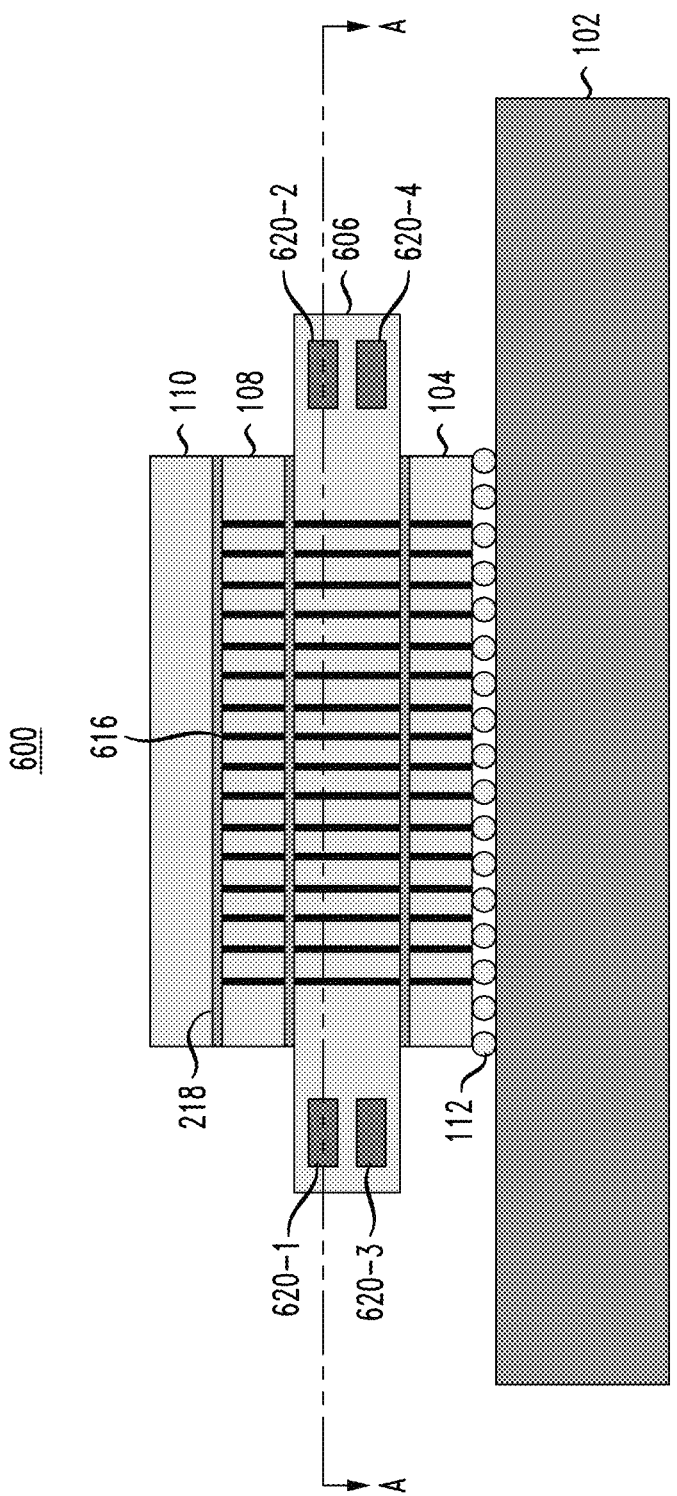
FIG. 6 depicts a side cross-sectional view of another chip stack including a thermal cooling unit, according to an embodiment of the present invention.

FIG. 6 shows a side cross-sectional view of chip stack 600 including thermal cooling unit 606. The chip stack 600 also includes elements 102, 104, 108, 110, 112 and 218 similar to those described above with respect to FIGS. 1-3. While the thermal cooling units 106 and 406 described above had a common footprint with the dies 104, 108 and 110, thermal cooling unit 606 in chip stack 600 extends outside outer edges of the die 104, 108 and 110. This allows the entire footprint of dies 104, 108 and 110 to contain TSVs 616 as shown in FIG. 6. While FIG. 6 shows an arrangement wherein the thermal cooling unit 606 extends outside or overhangs both the left and right sides of die 104, 108 and 110, embodiments are not so limited. More generally, a thermal cooling unit 606 may extend or overhang at least a portion of at least one edge of the die in a chip stack. For example, in some embodiments a thermal cooling unit may extend or overhang only the left or right edge of the die in a chip stack, or may overhang both the left, right, front and rear edges of the die in a chip stack, etc.

Figure 11:
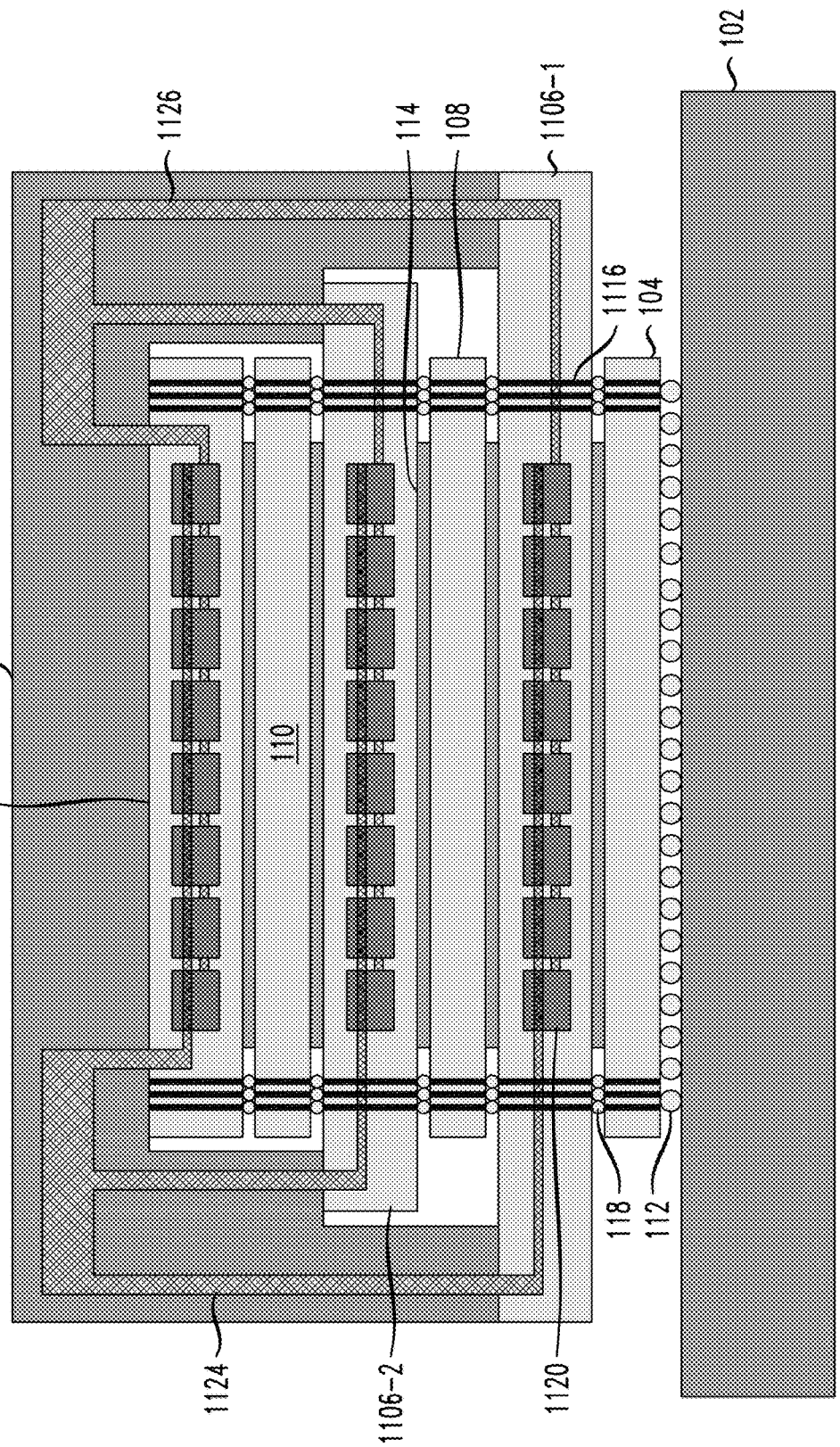
FIG. 11 depicts a side cross-sectional view of another chip stack with fluid connections from a lid on top of the package to multiple thermal cooling units, according to an embodiment of the present invention.

Extending the thermal cooling unit 606 beyond the edges of die 104, 108 and 110 enables fluidic connections to the thermal cooling unit 606. FIGS. 11 and 12, which will be described in further detail below, show examples of such fluidic connections which may be used for thermal cooling unit 606 and other thermal cooling units described herein.

As shown in FIG. 6, the thermal cooling unit 606 is larger than the die 104, 108 and 110. The thermal cooling unit 606 may thus be referred to as having a first portion that overlays the die 104 and is coextensive with die 108 and die 110 as well as a second portion that extends outwards from the edges of the die 104, 108 and 110. Microchannel coolers 620 are shown as being formed in the second portion, or the left and right sides of thermal cooling unit 606 that overhang edges of the die 104, 108 and 110. Although FIG. 6 shows two microchannel coolers 620-1 and 620-3 on a left side of the thermal cooling unit 604 overhanging left edges of die 104, 108 and 110 and two microchannel coolers 620-2 and 620-4 on a right side of the thermal cooling unit 604 overhanging right edges of die 104, 108 and 110, embodiments are not limited solely to this number and arrangement of microchannel coolers 620. In other embodiments, more or fewer than two microchannel coolers may be in a portion of a thermal cooling unit that overhangs one or more dies of a chip stack. As an example, the left side of the thermal cooling unit 604 may, in an alternate embodiment contain four microchannel coolers in a single row or column or in a grid arrangement. Also, while shown in FIG. 6 as having the same number and arrangement of microchannel coolers 620 on both the left and right sides overhanging the die 104, 108 and 110 of chip stack 600, in other embodiments different numbers and/or arrangements of microchannel coolers 620 may be on different portions of a thermal cooling unit overhanging one or more dies of a chip stack.

Figure 7:
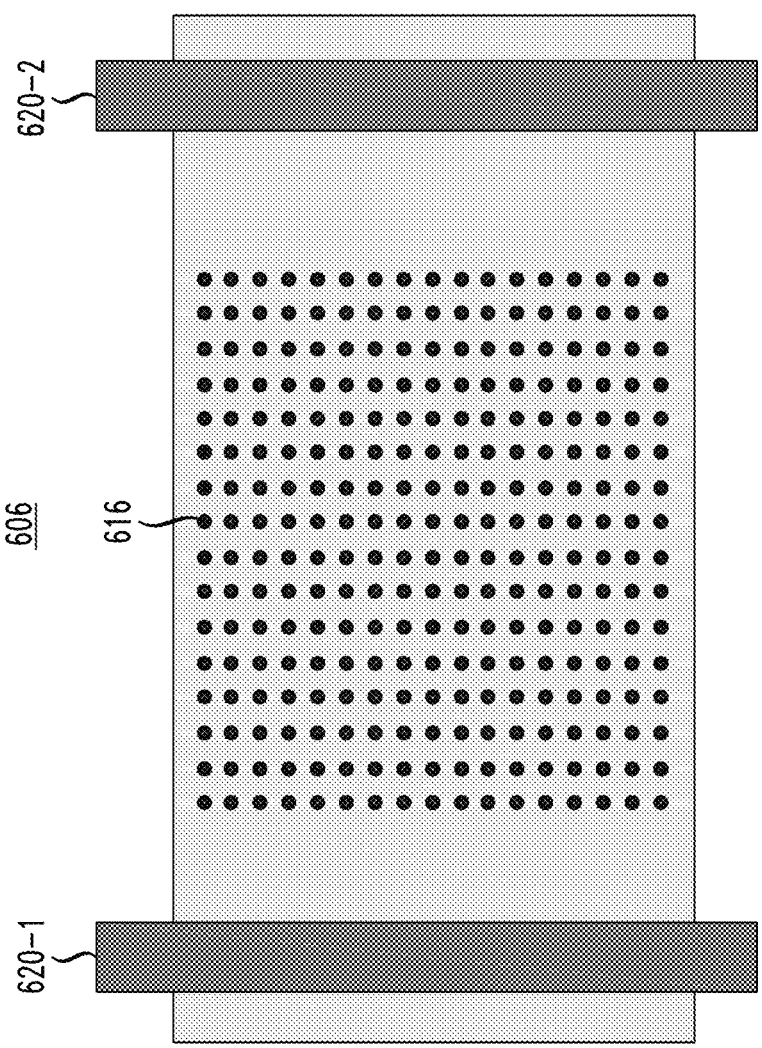
FIG. 7 depicts a top cross-sectional view of the thermal cooling unit of FIG. 6, according to an embodiment of the present invention.

FIG. 7 shows a top cross-sectional view of the thermal cooling unit 604 taken along the line A-A of FIG. 6. The FIG. 7 view shows TSVs 616 formed in an entire portion of the footprint of thermal cooling unit 604 coextensive with die 104, 108 and 110, referred to as a central portion of the thermal cooling unit 604 for convenience. While FIG. 7 shows a grid of TSVs 616 in the center portion of thermal cooling unit 604, embodiments are not so limited. Any pattern of TSVs may be formed in the center portion of the thermal cooling unit 604 as needed for interconnecting the die of a particular chip stack.

As shown in FIG. 7, microchannel coolers 620-1 and 620-2 are formed horizontally in the thermal cooling unit 604, and extend from one edge of the thermal cooling unit 604 to the other. Thus, each microchannel cooler 620 has its own inlet/outlet for fluid coolant to circulate through the microchannel coolers 620. In other embodiments, however, the ends of two or more of the microchannel coolers 620 may be connected via one or more common fluid channels in a manner similar to that described above with respect to thermal cooling unit 104 and/or thermal cooling unit 404. FIGS. 11 and 12, which will be described below, show examples of fluidic connections for fluid channels or microchannel coolers.

Figure 8:
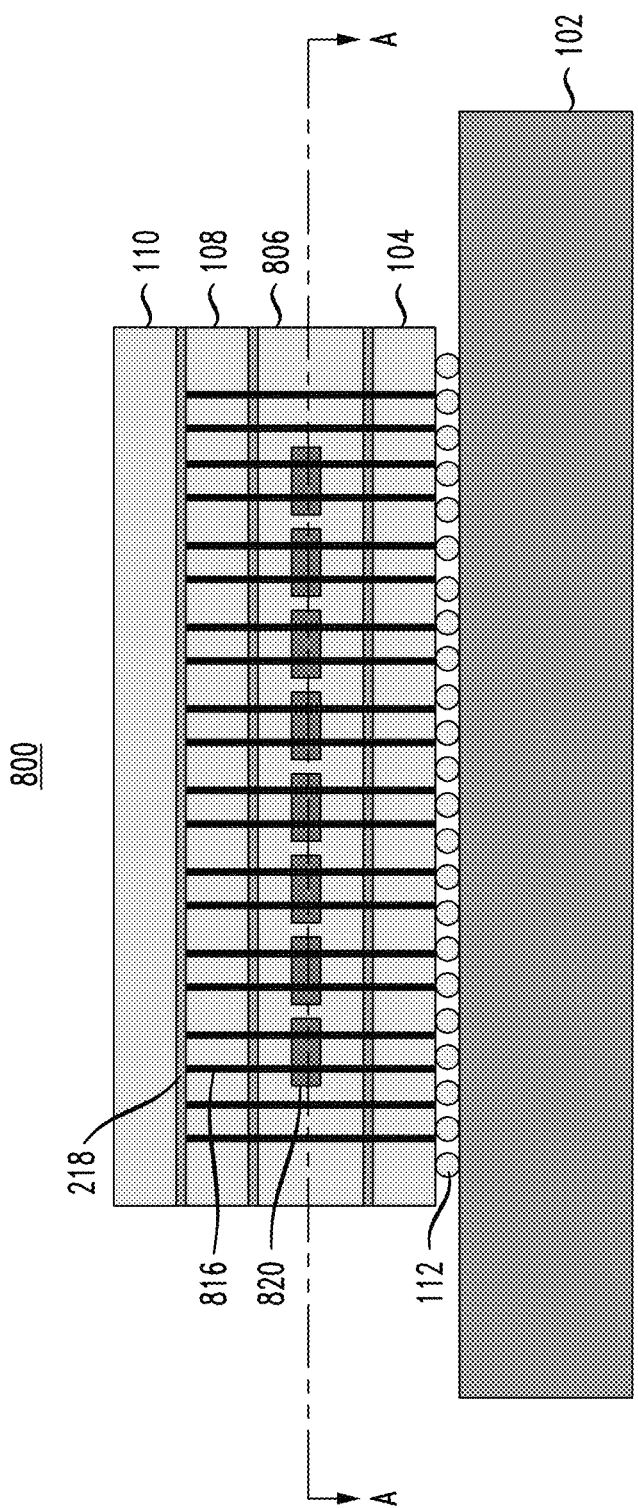
FIG. 8 depicts a side cross-sectional view of another chip stack including a thermal cooling unit, according to an embodiment of the present invention.

FIG. 8 shows a side cross-sectional view of a chip stack 800 including thermal cooling unit 806. The chip stack 800 also includes elements 102, 104, 108, 110, 112 and 218 similar to those described above with respect to FIGS. 1-3. In the chip stack 800, TSVs 816 are both routed through microchannel coolers 820 and are external to the microchannel coolers 820. It is to be appreciated, however, that in some embodiments the TSVs 816 may be routed only through the microchannel coolers 820, or through some but not all of the microchannel coolers 820. A dielectric fluid is used as the liquid coolant for microchannel coolers 820 having TSVs 816 routed therethrough. The dielectric fluid may be, by way of example, R1234ze or R245a refrigerants. Such refrigerants may be used in two phase flow boiling in which the liquid absorbs heat and changes to vapor as it flows through the microchannel coolers 820.

FIG. 8 shows a chip stack 800 wherein some TSVs 816 are formed vertically and pass through each of the horizontally formed microchannel coolers 820 and some TSVs 816 are formed vertically through the thermal cooling unit 806 while not passing through any of microchannel coolers 820, embodiments are not limited to this arrangement. In other embodiments, TSVs 816 may be formed only through the microchannel coolers 820, or through some but not all of the microchannel coolers 820.

Figure 9:
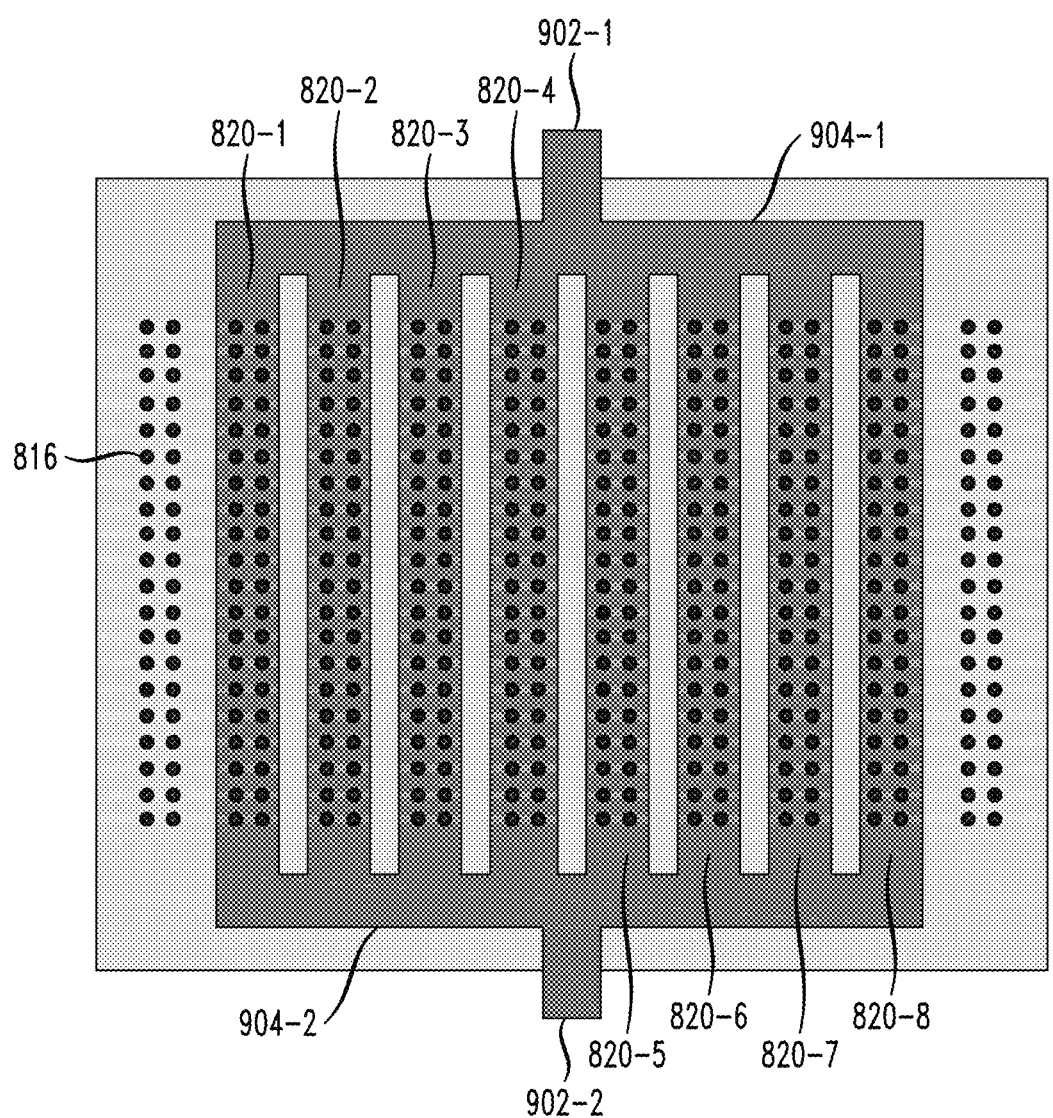
FIG. 9 depicts a top cross-sectional view of the thermal cooling unit of FIG. 8, according to an embodiment of the present invention.

FIG. 9 shows a top cross-sectional view of the thermal cooling unit 806, taken along the line A-A shown in FIG. 8. The FIG. 9 view shows microchannel coolers denoted 820-1 through 820-8, having first ends connected to common fluid channel 904-1 and second ends connected to common fluid channel 904-2, with fluid inlets/outlets 902-1 and 902-2. The arrangement of common fluid channels 904 and fluid inlets/outlets 902 is similar to that described above with respect to the common fluid channels 304 and fluid inlets/outlets 302 of FIG. 3. Similar to the thermal cooling unit 106, the thermal cooling unit 806 may have different numbers and/or arrangements of the common fluid channels 904 and fluid inlets/outlets 902.

Figure 10:
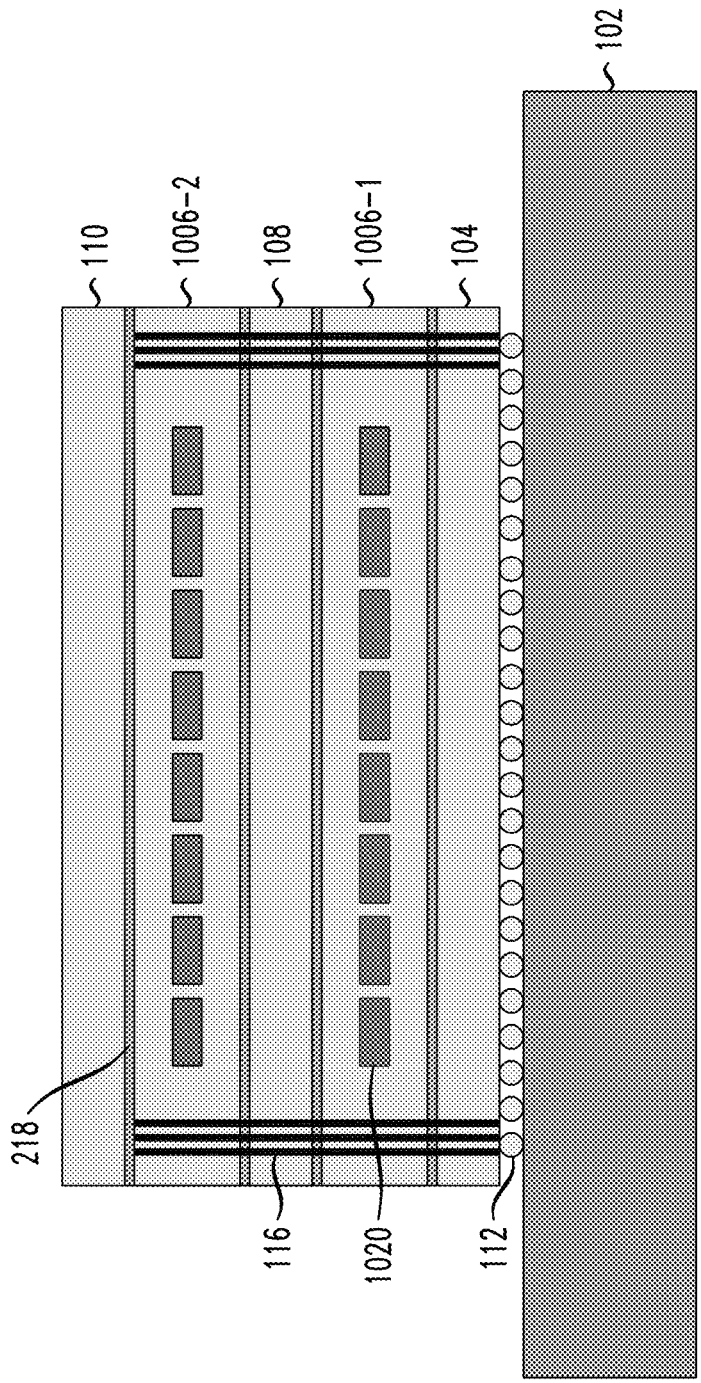
FIG. 10 depicts a side cross-sectional view of another chip stack including multiple thermal cooling units, according to an embodiment of the present invention.

In some embodiments, a chip stack may include multiple distinct thermal cooling units. For example, FIG. 10 shows a side cross-sectional view of a chip stack 1000 including thermal cooling units 1006-1 and 1006-2. The chip stack 1000 also includes elements 102, 104, 108, 110, 112 and 218 similar to those described above with respect to FIGS. 1-3. Each of the thermal cooling units 1006 in FIG. 10 is assumed to be similar to the thermal cooling unit 106 described above with respect to FIGS. 1-3. In other embodiments, more than two thermal cooling units may be utilized, including combinations of different types of the thermal cooling units described herein. Such a configuration may be desired, for example when a high power chip or die is used in a chip stack to allow cooling from both sides of the high power chip or die.

As described above, extending thermal cooling units beyond the edges of die 104, 108 and 110 permits additional fluidic connection configurations. FIGS. 11 and 12 show two examples of such additional configurations. In FIG. 11, a side cross-sectional view of chip stack 1100 is shown, where elements 102, 104, 108, 110, 112 and 114 are similar to those described above with respect to FIG. 1. The chip stack 1100 includes three thermal cooling units, denoted 1106-1, 1106-2 and 1106-3, collectively referred to herein as thermal cooling units 1106. TSVs 1116 extend through the die 104, 108 and 110 and thermal cooling units 1106 as shown. Each of the thermal cooling units 1106 includes a number of microchannel coolers 1120.

The thermal cooling units 1106-1, 1106-2 and 1106-3 are of increasing horizontal length in the chip stack 1100, enabling fluidic connections from a top lid 1122 to the thermal cooling units 1106. FIG. 11 particularly shows a front manifold 1124 and a back manifold 1126 on the left and right sides of the chip stack 1100, respectively. As shown, the front manifold 1124 connects to front ends of each of the microchannel coolers 1120 in the thermal cooling units 1106, providing for fluid entry to the microchannel coolers 1120. The back manifold 1126 connects to back ends of each of the microchannel coolers 1120 in the thermal cooling units 1106, providing for fluid exit from the microchannel coolers 1120. While the connecting channels of front manifold 1124 and back manifold 1126 are shown as thinner than the microchannel coolers 1120 for ease of illustration, in other embodiments the thickness of the connecting channels of front manifold 1124 and back manifold 1126 may vary.

Assembly of the top lid 1122 to the thermal cooling units 1106 may be done with a solder interface. Such an approach allows fluid connections to be made directly on the chip stack 1100 and does not require the substrate 102 to provide a fluid boundary. In some embodiments, a higher melting point solder is used for the die stack and a lower melting point solder is used to connect the top lid 1122 to the thermal cooling units 1106. If the die 104, 108 and 110 were interconnected using copper bonding rather than μC4 interconnects 118 like in the FIG. 2 chip stack 200, the solder used for the assembly of the manifold to the thermal cooling units may utilize a wider range of melting points.

Figure 12:
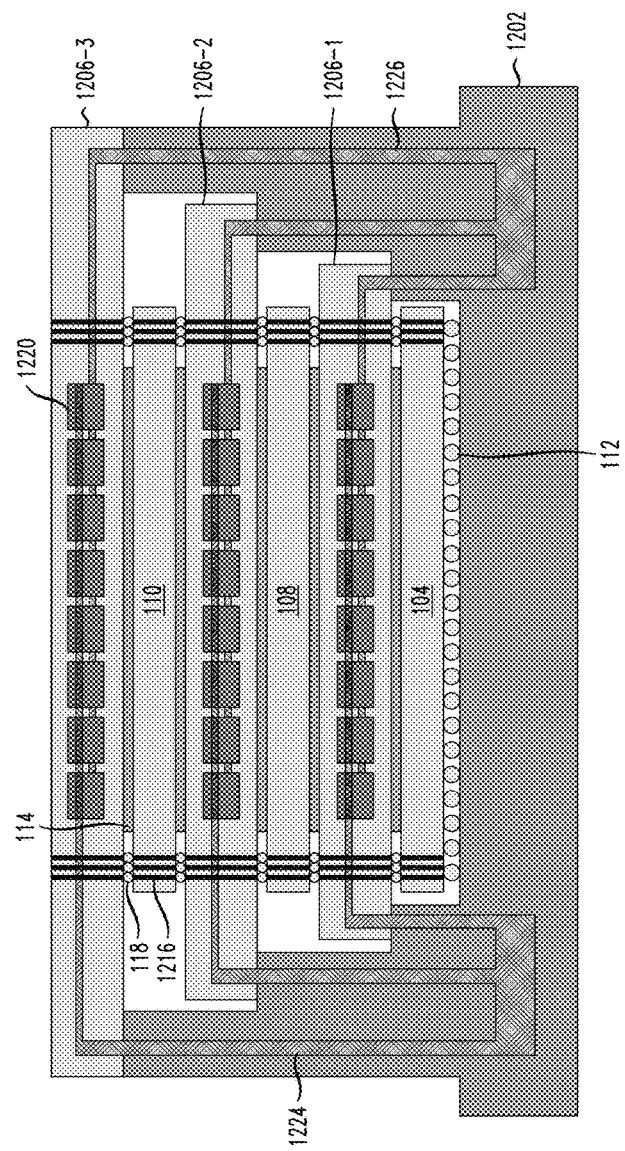
FIG. 12 depicts a side cross-sectional view of another chip stack with fluid connections from the package substrate to multiple thermal cooling units, according to an embodiment of the present invention.

FIG. 12 shows a side cross-sectional view of chip stack 1200, where elements 104, 108, 110, 112, 114 and 118 are similar to those described above with respect to FIG. 1. In the chip stack 1200, substrate 1202 provides integrated fluid distribution through interconnecting fluid channels of front manifold 1224 and back manifold 1226, which connect to thermal cooling units 1206-1, 1206-2 and 1206-3, collectively referred to herein as thermal cooling units 1206. TSVs 1216 are routed through the thermal cooling units 1206 as shown in FIG. 12. The thermal cooling units 1206 each include a number of microchannel coolers 1220. As shown, the front manifold 1224 connects to front ends of each of the microchannel coolers 1220 in the thermal cooling units 1206, providing for fluid entry to the microchannel coolers 1220. The back manifold 1226 connects to back ends of each of the microchannel coolers 1220 in the thermal cooling units 1206, providing for fluid exit from the microchannel coolers 1220. While the connecting channels of front manifold 1224 and back manifold 1226 are shown as thinner than the microchannel coolers 1220 for ease of illustration, in other embodiments the thickness of the connecting channels of front manifold 1224 and back manifold 1226 may vary.

In some embodiments, the die 104, 108 and 110 and thermal cooling units 1206 may be pre-assembled and then bonded to substrate 1202 making fluid connections and electrical connections in a same solder assembly process. The die stack solder bumps 112 may be underfilled after assembly as fluid connections can be made on two edges of the stack, exposing the other edges to allow underfill for the solder bumps 112.

Figure 13:
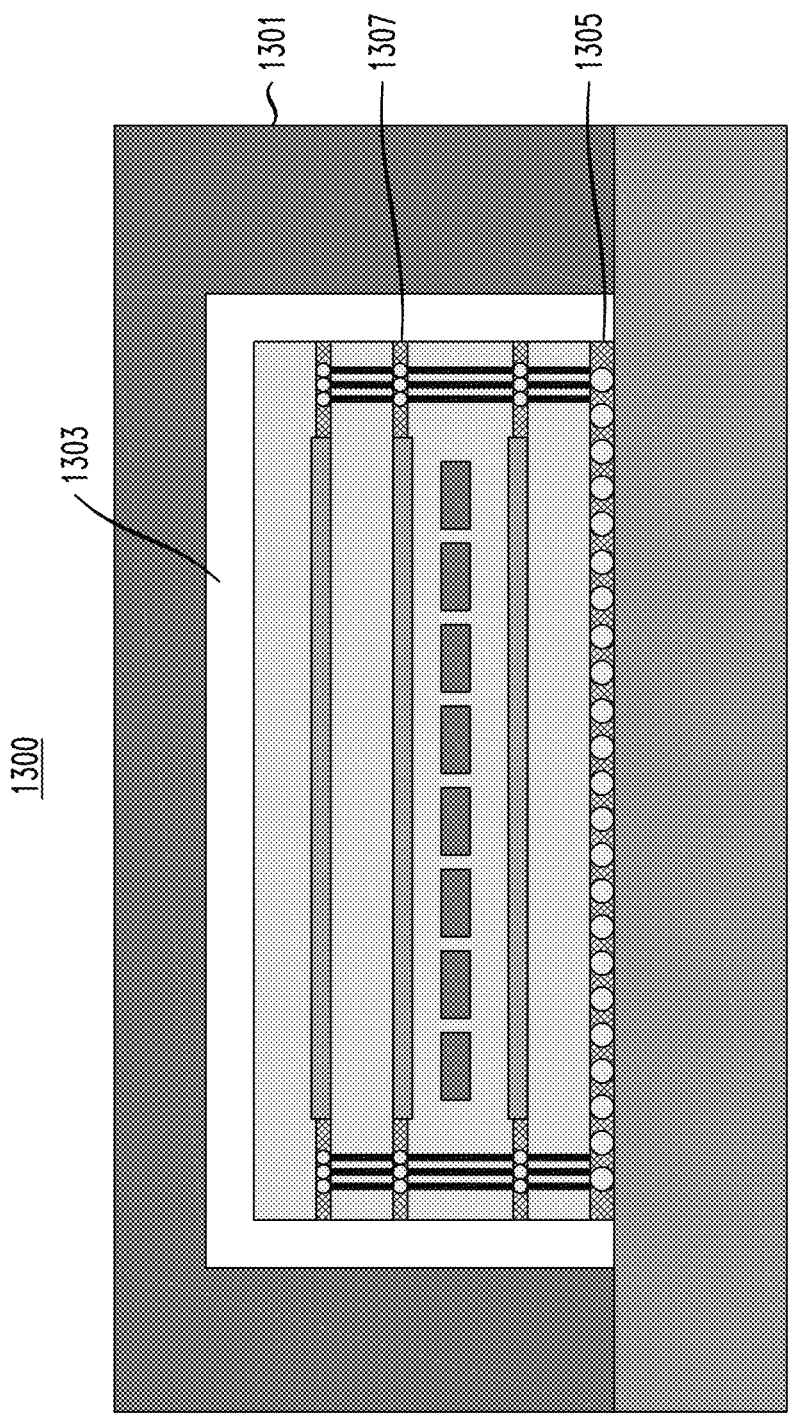
FIG. 13 depicts a side cross-sectional view of the FIG. 1 chip stack with fluid connections using a lid and package substrate wherein die in the chip stack are interfilled, according to an embodiment of the present invention.

FIG. 13 shows a cross-sectional view of a 3D IC 1300. The 3D IC 1300 includes the chip stack 100 of FIG. 1, the elements of which are not labeled for clarity. 3D IC 1300 also includes a lid 1301 with a sealant 1303 surrounding the die 104, 108 and 110 and thermal cooling unit 106. As shown, the bottom of die 104 is underfilled with material 1305 and the areas between die 104, thermal cooling unit 106, die 108 and die 110 are interfilled with material 1307 to prevent fluid contacting the electrical interconnects. The bottom of lid 1301 may be bonded to substrate 102 using an adhesive or solder.

Figure 15:
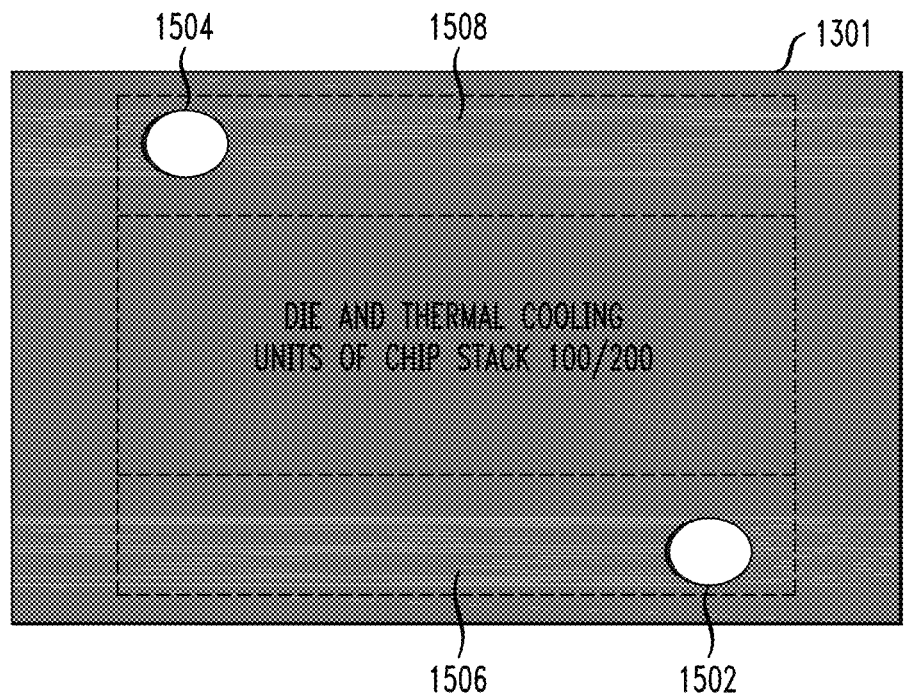
FIG. 15 depicts a top view of the lid of FIG. 13 or FIG. 14, according to an embodiment of the present invention.

As will be illustrated in the context of FIG. 15, the lid 1301 is larger than the die 104, 108, 110 and thermal cooling unit 106 of the underlying chip stack 100. A fluid entrance (1502 in FIG. 15) near a front of the lid 1301 allows fluid to enter a front cavity (1506 in FIG. 15) formed between the lid 1301 and a front of chip stack 100. Similarly, a fluid exit (1504 in FIG. 15) near a back of the lid 1301 allows fluid exit from a back cavity (1508 in FIG. 15) formed between the lid 1301 and a back of chip stack 100. Thus, the front cavity and back cavity allow for fluid to enter the microchannel coolers 120 of chip stack 100. Sealant 1303 prevents the fluid in the front cavity and back cavity from going around the chip stack 100 thus forcing the fluid through the microchannel coolers 120 of chip stack 100. The lid 1301 may be bonded onto the top and sides of the chip stack 100 to allow fluid flow from the front to the back of the chip stack 100.

Solder bumps 112 are underfilled with material 1305 and μC4 interconnects 118 are interfilled with material 1307 to insulate the solder bumps 112 and μC4 interconnects 118 from the fluid coolant and eliminate them from the fluid path. In embodiments wherein dielectric fluids are used as the fluid coolant, the underfill and interfill may not be required. However, the underfill and interfill may still be used to reduce mechanical stress on the package resulting from coefficient of thermal expansion mismatch between the die 104, 108, 110, thermal cooling unit 106 and substrate 102, particularly when an organic material is used for substrate 102. When a ceramic or silicon material is used for substrate 102, the coefficients of thermal expansion may match well.

Figure 14:
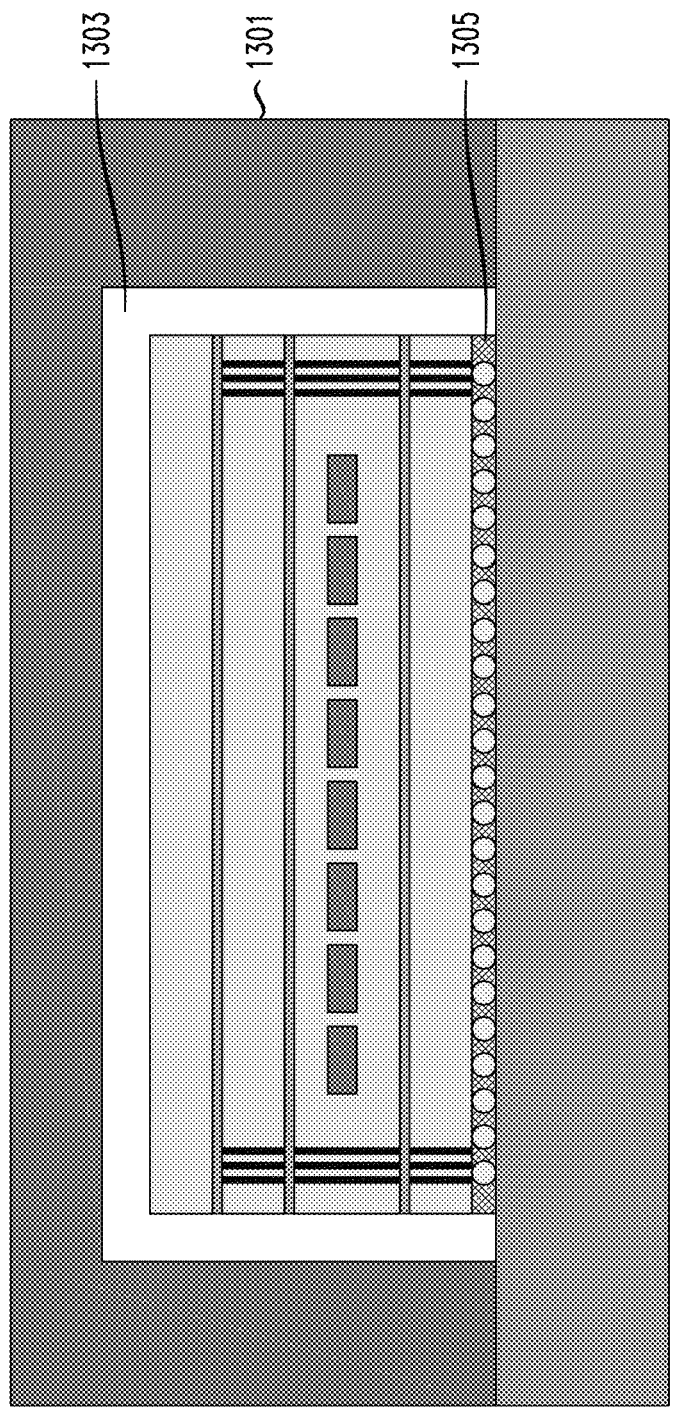
FIG. 14 depicts a side cross-sectional view of the FIG. 2 chip stack with fluid connections using a lid and package substrate, according to an embodiment of the present invention.

FIG. 14 shows a cross-sectional view of 3D IC 1400. The 3D IC 1400 includes the chip stack 200 of FIG. 2, the elements of which are not labeled in FIG. 14 for clarity. 3D IC 1400 also includes the lid 1301 and the sealant 1403 surrounding the die 104, 108, 110 and thermal cooling unit 106. Whereas in 3D ICk 1300 interfill material 1307 was used to interfill μC4 interconnects 118, the interfill material 1307 is not required in the 3D IC 1400 as the underlying chip stack 200 utilizes copper bonding rather than μC4 interconnects. 3D IC 1400 still utilizes underfill material 1305. In embodiments wherein a dielectric fluid is utilized as the fluid coolant, however, the underfill material 1305 is not required but may be used for reducing mechanical stresses.

FIG. 15 depicts a top view of the lid 1301 used in 3D ICs 1300 and 1400. As shown, the lid 1301 includes a fluid entrance 1502 and a fluid exit 1504. While FIG. 15 shows the lid 1301 including only a single fluid entrance and fluid exit, embodiments are not so limited. In other embodiments, multiple fluid entrances and fluid exits may be utilized. The particular placement of the fluid entrances and fluid exits for lid 1301 may also vary. FIG. 15, shows, in dashed outline, how the lid 1301 is larger than the underlying chip stack 100 or 200. FIG. 15 also illustrates the above-described front cavity 1506 and back cavity 1508 in dashed outlines.

While FIGS. 13-15 show an example of a lid 1301 which may be utilized for chip stacks 100 and 200, the lid 1301 may be used for other chip stacks described herein suitably modified for the structure and arrangement of the die and thermal cooling units in such chip stacks.

FIG. 16 depicts fabrication of a thermal cooling unit, particular the thermal cooling unit 106 used in chip stacks 100 and 200. As shown, two die halves 1601 and 1603 are fabricated with TSVs 116 and portions of microchannel coolers 120. The walls of the microchannel coolers 120 may be textured, which provides improved thermal conduction by increasing the surface area of the microchannel coolers 120. Where the cooling unit 106 is made of silicon, this increases thermal conduction between the fluid and silicon. The walls of TSVs 116 may be insulated with an oxide to electrically isolate the TSVs 116, which may be made of a conductive material such as copper or tungsten. Pads are also isolated from the silicon using a passivation or oxide layer.

A description of a process for forming thermal cooling unit 106 is provided below. It is to be appreciated, however, that other techniques may be used to form a thermal cooling unit in other embodiments and that particular dimensions and values are presented by way of example only. A 750 µm thick silicon wafer may be etched using deep reactive-ion etching (DRIE) to a depth of 100 µm to form TSVs 116. The TSVs 116 may be insulated with oxide and filled with copper. The silicon wafer may be bonded to a handler wafer and thinned to 95 µm so as to expose the TSVs 116 on both sides of the wafer. Fluidic channels such as microchannel coolers 120 are patterned and etched to a depth of 50 µm to form each of the die halves 1601 and 1603. The die halves 1601 and 1603 are then bonded together, using for example thermo-compression copper bonding to connect TSVs 116 in the die halves 1601 and 1603 and to form leak tight microchannel coolers 120. The copper bond also ensures good thermal conductivity between the two die halves 1601 and 1603. The resulting structure is then released from the handler wafer, which may be a glass handler, and then diced to release thermal cooling unit 106.

While the various chip stacks described herein have been shown with only one die 104 between the substrate 102 and the thermal cooling unit 106, 406, 606, 806, 1006-1, 1106-1 and 1206-1, embodiments are not so limited. In other embodiments, differing numbers of dies or chips may be arranged above and/or below the thermal cooling units 106, 406, 606, 806, 1006, 1106 and 1206. Also as discussed above, the particular numbers of TSVs and microchannel coolers in the thermal cooling units 106, 406, 606, 806, 1006, 1106 and 1206 may vary according to the needs of a particular 3D IC structure.

The microchannel coolers 120, 420, 620, 820, 1020, 1120 and 1220 may utilize different types of coolants. In some embodiments, such microchannel coolers or fluid channels may utilize gas as a coolant. In other embodiments, liquid coolants may be utilized such as water or a dielectric fluid. Examples of liquid coolants which may be used in some embodiments are water or a water/propylene glycol mixture. While water alone is a better thermal conductor than the water/propylene glycol mixture, adding propylene glycol to water lowers the freezing point of the coolant thereby avoiding or lessening freezing concerns. In some embodiments, anti-corrosives, biocides or other additives may be used in the water or water/propylene glycol mixture. In some embodiments gas coolants may be used instead of liquid coolants. Gas coolants may include, by way of example, air, nitrogen, helium, or mixtures of these and other gases. Gas coolants generally have lower thermal conductivity relative to liquid coolants, and thus to achieve comparable cooling with a gas coolant high speed jets may be required. Among the gas coolants listed above, helium has a highest thermal conductivity.

Integrated circuit chips, such as the chip stacks 100, 200, 400, 600, 800, 1000, 1100, 1200, 1300 and 1400, can be manufactured and distributed in single wafer form (that is, as a single wafer with multiple unpackaged chips), or multiple bonded wafers (that is wafers which have been bonded together) or as individual bare die or assembled die stacks. The die or die stacks may either be on handler wafers or packaged onto a chip substrate. In the latter case the chip is mounted on a substrate or carrier and the chip package has either pads or a ball grid array for connection to a higher level package such as a printed circuit board. The chip carrier may be organic, ceramic, glass or silicon and would include electric connections for the chip and the next level package. In some cases the chip carrier may include fluid connections. In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. An apparatus comprising:
a first die;
a thermal cooler disposed over at least a portion of the first die;
a second die disposed over at least a portion of the thermal cooler; and
a plurality of through-silicon vias providing electrical connections between the first die and the second die;
wherein the thermal cooler comprises a plurality of fluid channels for fluid cooling of the first die and the second die, each of the plurality of fluid channels disposed horizontally through the thermal cooler;
wherein the plurality of through-silicon vias are disposed vertically through the first die, the thermal cooler and the second die;

wherein the thermal cooler comprises a first silicon wafer die half and a second silicon wafer die half, each of the first silicon wafer die half and the second silicon wafer die half comprising a plurality of vias disposed in outer edge portions thereof and a plurality of trenches disposed in an inner portion thereof, the outer edge portions of the first silicon wafer die half and the second silicon wafer die half surrounding the inner portions of the first silicon wafer die half and the second silicon wafer die half, respectively; and wherein the first silicon wafer die half and the second silicon wafer die half are thermo-compression copper bonded to connect the plurality of vias disposed in the outer edge portions thereof to one another forming connected pairs of vias and to connect the plurality of trenches disposed in the inner portions thereof to one another forming connected pairs of trenches, each connected pair of trenches providing one of the plurality of microchannel coolers and each connected pair of vias providing a portion of one of the plurality of through-silicon vias.

2. The apparatus of claim 1, wherein the first die and the thermal cooler are bonded via a thermal interface material providing thermal heat conduction.

3. The apparatus of claim 1, wherein the plurality of through-silicon vias connect the first die and the thermal cooler via micro controlled-collapse chip-connection interconnects.

4. The apparatus of claim 1, wherein the plurality of through-silicon vias connect the first die and the thermal cooler via copper-to-copper bonding.

5. The apparatus of claim 1, further comprising at least one lead routed through at least one of the through-silicon vias, wherein the at least one lead comprises at least one of an electrical lead and a power lead.

6. The apparatus of claim 1, further comprising:
an additional thermal cooler disposed over at least a portion of the second die; and
a third die disposed over at least a portion of the additional thermal cooler;
wherein the thermal cooler and the additional thermal cooler each overhang edges of the first die, the second die and the third die; and
wherein a first overhang of the thermal cooler is different than a second overhang of the additional thermal cooler.

7. The apparatus of claim 1, wherein the plurality of fluid channels are connected to one another via at least one common fluid channel comprising at least one fluid inlet and at least one fluid outlet.

8. The apparatus of claim 1, wherein the plurality of fluid channels comprise a liquid coolant.

9. The apparatus of claim 8, wherein the liquid coolant comprises a dielectric liquid.

10. The apparatus of claim 8, wherein the liquid coolant comprises water.

11. The apparatus of claim 1, further comprising a substrate, the substrate providing fluid connections to portions of the thermal cooler which overhang edges of the first die and the second die.

12. The apparatus of claim 1, wherein walls of the trenches in each of the first silicon wafer die half and the second silicon wafer die half are textured increasing a surface area thereof.

13. The apparatus of claim 1, further comprising an oxide disposed on walls of the vias in each of the first silicon wafer die half and the second silicon wafer die half.

14. The apparatus of claim 1, wherein each of the plurality of through-silicon vias is disposed in the outer edge portions of the thermal cooler and each of the plurality of fluid channels is disposed in the inner portion of the thermal cooler.

15. The apparatus of claim 14, wherein the outer edge portions of the thermal cooler do not overlap the inner portion of the thermal cooler.

16. An integrated circuit comprising:
a chip stack comprising:
at least a first die and a second die; and
a thermal cooler interposed between the first die and the second die;
wherein the chip stack comprises a plurality of through-silicon vias providing electrical connections between the first die and the second die;
wherein the thermal cooler comprises a plurality of fluid channels for fluid cooling of the first die and the second die, each of the plurality of fluid channels being disposed horizontally through the thermal cooler;
wherein the plurality of through-silicon vias are disposed vertically through the first die, the thermal cooler and the second die;
wherein the thermal cooler comprises a first silicon wafer die half and a second silicon wafer die half, each of the first silicon wafer die half and the second silicon wafer die half comprising a plurality of vias disposed in outer edge portions thereof and a plurality of trenches disposed in an inner portion thereof, the outer edge portions of the first silicon wafer die half and the second silicon wafer die half surrounding the inner portions of the first silicon wafer die half and the second silicon wafer die half, respectively; and
wherein the first silicon wafer die half and the second silicon wafer die half are thermo-compression copper bonded to connect the plurality of vias disposed in the outer edge portions thereof to one another forming connected pairs of vias and to connect the plurality of trenches disposed in the inner portions thereof to one another forming connected pairs of trenches, each connected pair of trenches providing one of the plurality of microchannel coolers and each connected pair of vias providing a portion of one of the plurality of through-silicon vias.

17. A method comprising:
forming a first die;
forming a thermal cooler over at least a portion of the first die;
forming a second die over at least a portion of the thermal cooler;
forming a plurality of through-silicon vias vertically through the first die, the thermal cooler and the second die, the plurality of through-silicon vias providing electrical connections between the first die and the second die; and
forming a plurality of fluid channels horizontally through the thermal cooler, the plurality of fluid channels providing fluid cooling of the first die and the second die;
wherein the thermal cooler comprises a first silicon wafer die half and a second silicon wafer die half, each of the first silicon wafer die half and the second silicon wafer die half comprising a plurality of vias disposed in outer edge portions thereof and a plurality of trenches disposed in an inner portion thereof, the outer edge portions of the first silicon wafer die half and the second silicon wafer die half surrounding the inner portions of the first silicon wafer die half and the second silicon wafer die half, respectively; and wherein the first silicon wafer die half and the second silicon wafer die half are thermo-compression copper bonded to connect the plurality of vias disposed in the outer edge portions thereof to one another forming connected pairs of vias and to connect the plurality of trenches disposed in the inner portions thereof to one another forming connected pairs of trenches, each connected pair of trenches providing one of the plurality of microchannel coolers and each connected pair of vias providing a portion of one of the plurality of through-silicon vias.

18. The method of claim 17, wherein forming the thermal cooler comprises:

forming a first plurality of trenches by deep reactive-ion etching outer edge portions of the first silicon wafer die half and the second silicon wafer die half to a first depth;

depositing an oxide on sidewalls of the first plurality of trenches; and filling the first plurality of trenches with copper;

bonding the first silicon wafer die half and the second silicon wafer die half to respective handler wafers; and thinning the first silicon wafer die half and the second silicon wafer die half to expose bottom walls of the first plurality of trenches to form the plurality of vias disposed in the outer edge portions of the first silicon wafer die half and the second silicon wafer die half.

19. The method of claim 18, further comprising:

patterning and etching inner portions of the first silicon wafer die half and the second silicon wafer die half to a second depth smaller than the first depth to form a second plurality of trenches.

20. The method of claim 19, further comprising:

bonding the first silicon wafer die half to the second silicon wafer die half to form a bonded silicon wafer;

releasing the bonded silicon wafer from the handler wafers; and dicing the bonded silicon wafer to form the thermal cooler.

* * * * *